US010763262B2

(12) United States Patent
Shih

(10) Patent No.: US 10,763,262 B2
(45) Date of Patent: Sep. 1, 2020

(54) METHOD OF PREPARING SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 142 days.

(21) Appl. No.: 16/215,098

(22) Filed: Dec. 10, 2018

(65) Prior Publication Data

US 2020/0168615 A1  May 28, 2020

Related U.S. Application Data

(60) Provisional application No. 62/770,906, filed on Nov. 23, 2018.

(51) Int. Cl.
*H01L 27/108* (2006.01)

(52) U.S. Cl.
CPC .. *H01L 27/10888* (2013.01); *H01L 27/10814* (2013.01); *H01L 27/10823* (2013.01); *H01L 27/10876* (2013.01); *H01L 27/10885* (2013.01)

(58) Field of Classification Search
CPC ......... H01L 27/10888; H01L 27/10814; H01L 27/10855; H01L 27/10876; H01L 27/10823
See application file for complete search history.

(56) References Cited

U.S. PATENT DOCUMENTS

| 9,035,416 | B2* | 5/2015 | Fischer | H01L 21/0338 |
| | | | | 257/499 |
| 9,177,797 | B2* | 11/2015 | Chang | H01L 21/0338 |
| 9,793,158 | B2* | 10/2017 | Siew | H01L 21/76871 |
| 2012/0282778 | A1* | 11/2012 | Light | H01L 21/0338 |
| | | | | 438/703 |

(Continued)

FOREIGN PATENT DOCUMENTS

| TW | 484209 | 4/2002 |
| TW | 201839852 A | 11/2018 |

OTHER PUBLICATIONS

Office Action dated Apr. 7, 2020 related to Taiwanese Application No. 107147238.

*Primary Examiner* — Michael M Trinh
(74) *Attorney, Agent, or Firm* — Muncy, Geissler, Olds & Lowe, P.C.

(57) ABSTRACT

The present disclosure provides a method for preparing a semiconductor structure. The method includes the following steps. A substrate including a conductive layer formed thereon is provided. The conductive layer is patterned to form a plurality of conductive patterns extending along a first direction. A cap layer is conformally formed to cover the plurality of conductive patterns. A patterned hard mask is formed over the cap layer. The plurality of conductive patterns are etched through the patterned hard mask to form a plurality of conductive islands. In some embodiments, the plurality of conductive islands are separated from each other by a plurality of first gaps along the first direction. In some embodiments, the plurality of conductive islands are separated from each other by the cap layer and a plurality of second gaps along a second direction that is different from the first direction.

20 Claims, 12 Drawing Sheets

(56) References Cited

U.S. PATENT DOCUMENTS

| | | | |
|---|---|---|---|
| 2015/0357336 A1* | 12/2015 | Sukekawa | H01L 27/10885 257/296 |
| 2016/0118388 A1* | 4/2016 | Tonari | H01L 27/10876 438/253 |
| 2016/0197042 A1* | 7/2016 | Lee | H01L 23/5329 257/751 |
| 2017/0294439 A1* | 10/2017 | Kim | H01L 27/228 |

* cited by examiner

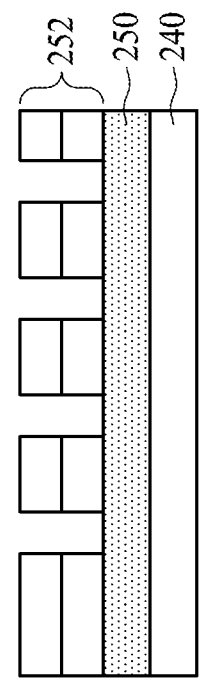
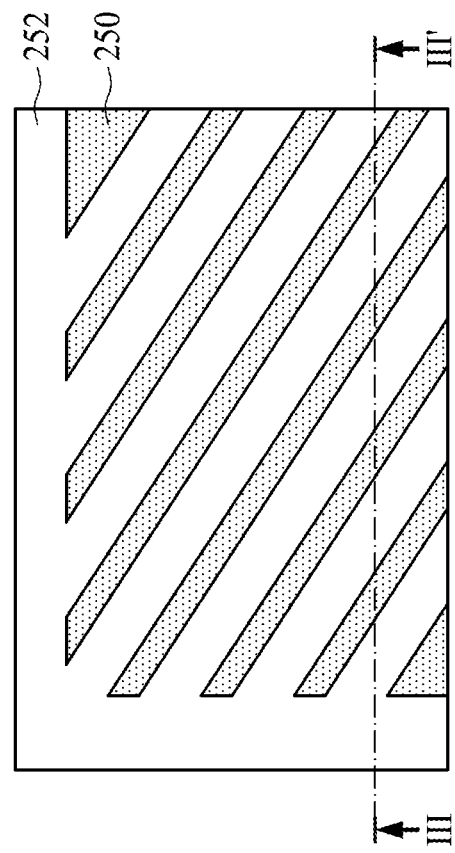
FIG. 3B
FIG. 3A

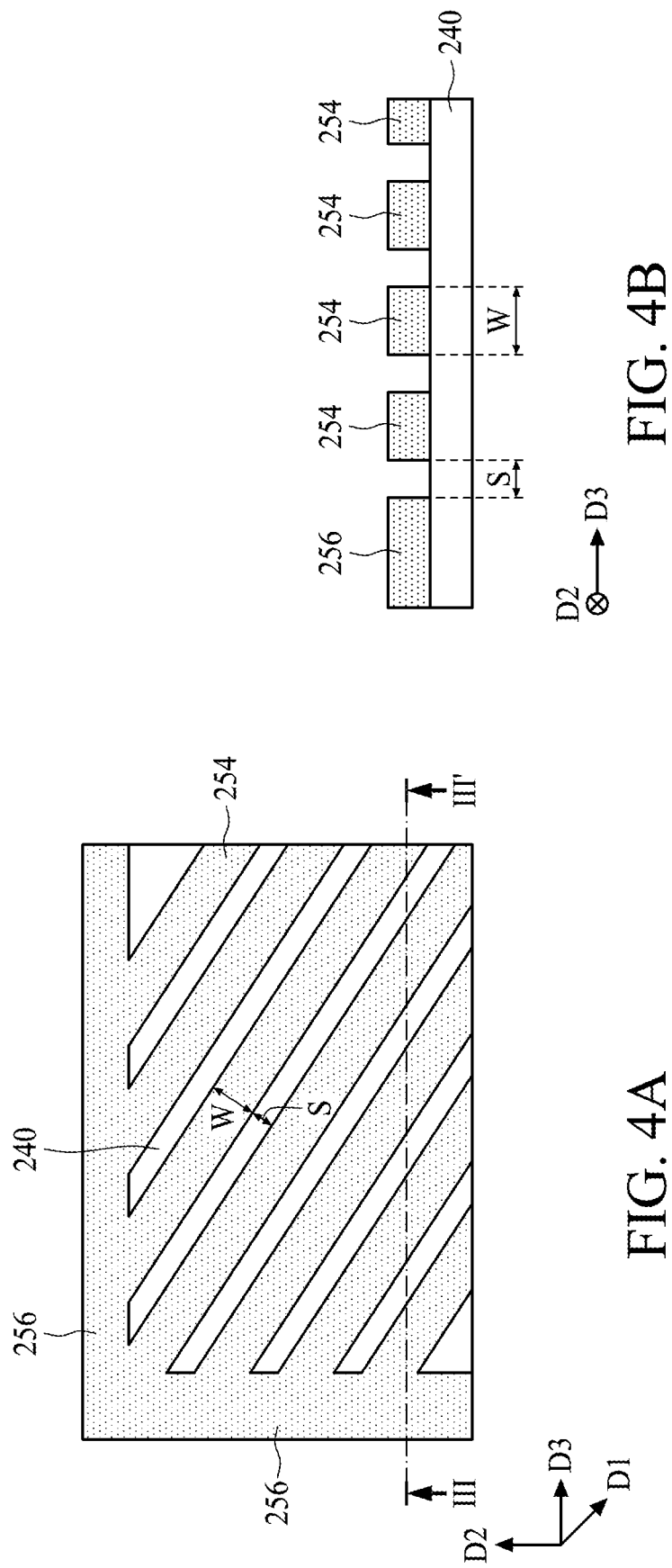

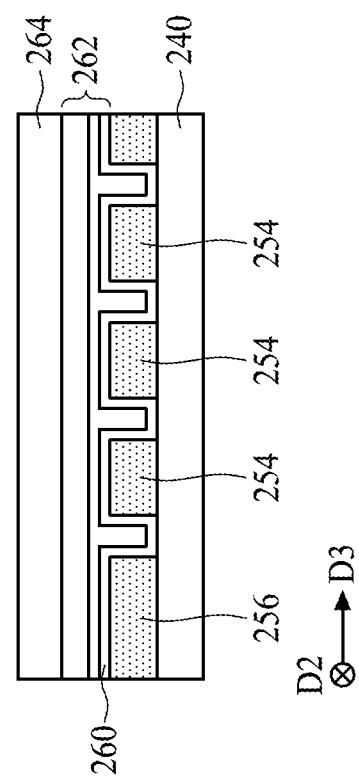
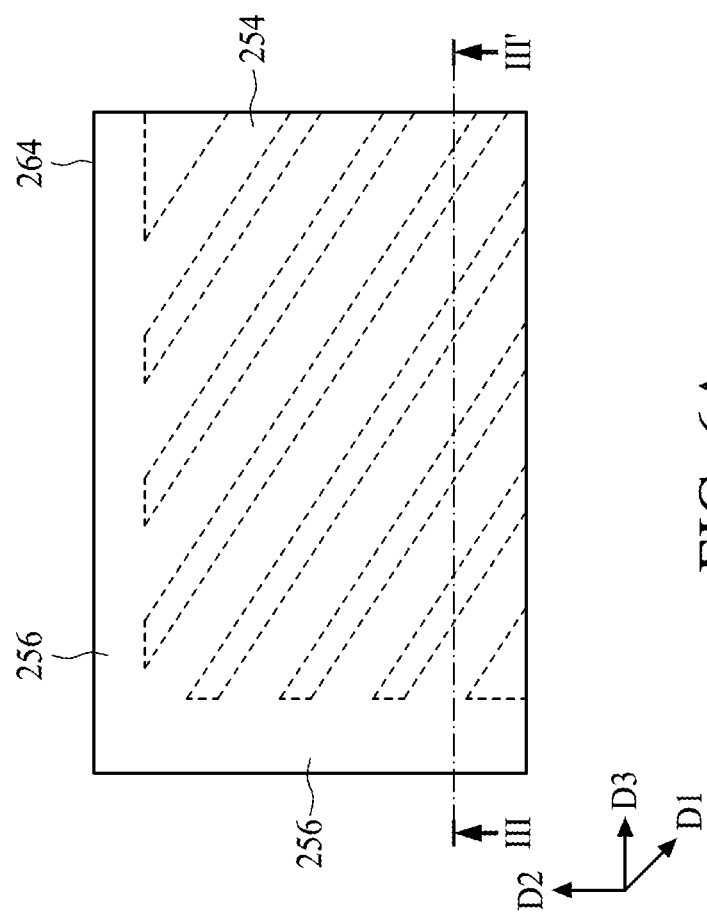
FIG. 6B
FIG. 6A

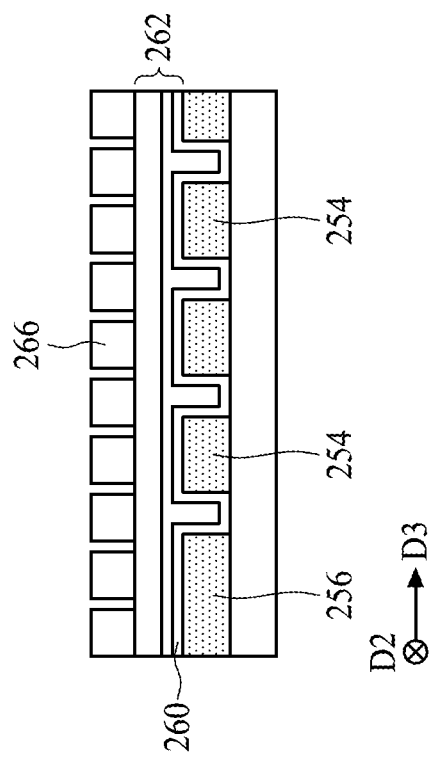
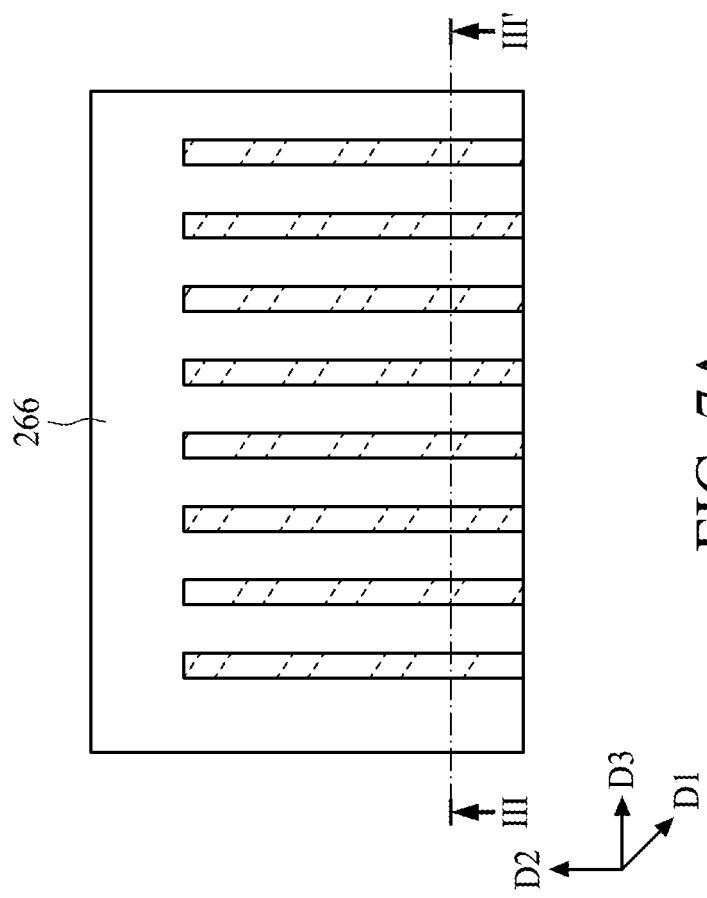
FIG. 7B
FIG. 7A

METHOD OF PREPARING SEMICONDUCTOR STRUCTURE

PRIORITY CLAIM AND CROSS-REFERENCE

This application claims the priority benefit of U.S. provisional application Ser. No. 62/770,906, filed on Nov. 23, 2018. The entirety of the above-mentioned patent application is hereby incorporated by reference herein and made a part of this specification.

TECHNICAL FIELD

The present disclosure relates to a method for preparing a semiconductor structure, and more particularly, to a method for preparing a semiconductor structure for dynamic random access memory (DRAM) cells.

DISCUSSION OF THE BACKGROUND

As the semiconductor industry introduces new generations of integrated circuits (IC's) having higher performance and providing greater functionality, the density of the elements that form the ICs is increased, while the dimensions, sizes, and spacing between the individual components or elements are reduced. These device geometries having smaller dimensions are creating new manufacturing challenges.

For example, a continuous challenge in the semiconductor memory industry is to decrease the size of memory cell components in order to increase the packing density of the DRAM chip. Over the last few device generations, DRAM manufacturers have developed alternative cell layouts that reduce the area occupied on the chip. The latest designs allow a significant increase in density by burying the word line in the silicon substrate, then fabricating the bit line (also known as the digit line) and capacitor on top to form a vertical stack. Such devices are also known as buried word line (BWL) devices.

In such a memory device, the bit line and the capacitor are often fabricated over the surface of the semiconductor substrate. Therefore, a cell contact is required to provide electrical connection between the bit line and the active area of the semiconductor substrate, a landing pad is required to accommodate the capacitor, and another cell contact is required to provide electrical connection between the landing pad and the active area of the semiconductor substrate.

However, the formation of the landing pad involves several complicated steps. Furthermore, as integrated circuit designs become denser, it becomes more difficult to form the landing pads separate from each other in the array.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing a semiconductor structure. The method includes the following steps. A substrate including a conductive layer formed thereon is provided. The conductive layer is patterned to form a plurality of conductive patterns extending along a first direction. A cap layer is conformally formed to cover the plurality of conductive patterns. A patterned hard mask is formed over the cap layer. The plurality of conductive patterns are etched through the patterned hard mask to form a plurality of conductive islands. In some embodiments, the plurality of conductive islands are separated from each other by a plurality of first gaps along the first direction. In some embodiments, the plurality of conductive islands are separated from each other by the cap layer and a plurality of second gaps along a second direction that is different from the first direction.

In some embodiments, the conductive layer includes doped polysilicon (Si), tungsten (W), tungsten silicide (WSi), aluminum (Al), titanium (Ti), titanium nitride (TiN), or cobalt (Co).

In some embodiments, the method further includes forming an edge pattern, and the plurality of conductive patterns are coupled to the edge pattern.

In some embodiments, the plurality of conductive islands are separated from the edge pattern.

In some embodiments, the cap layer covers sidewalls and a top surface of each conductive pattern.

In some embodiments, the cap layer includes an insulating material.

In some embodiments, a thickness of the cap layer is between approximately 10 angstroms and approximately 100 angstroms.

In some embodiments, the forming of the patterned hard mask further includes the following steps. A passivation layer is formed over the substrate to form an even surface. A hard mask layer is formed on the passivation layer. The hard mask layer is patterned to form the patterned hard mask.

In some embodiments, a space between adjacent conductive patterns is filled with the passivation layer.

In some embodiments, the plurality of first gaps extend along the second direction. In some embodiments, the plurality of second gaps extend along the first direction.

In some embodiments, the plurality of first gaps and the plurality of second gaps form a grid that separates the plurality of conductive islands from each other.

In some embodiments, sidewalls of the plurality of conductive islands are exposed through the plurality of first gaps along a third direction. In some embodiments, the third direction is different from the first direction and the second direction.

In some embodiments, the second direction and the third direction are perpendicular to each other.

In some embodiments, the cap layer covers a top surface and the sidewall of each conductive island along the second direction.

In some embodiments, the cap layer covers bottom surfaces and sidewalls of the plurality of second gaps along the second direction.

In some embodiments, the substrate further includes a gate structure disposed in the substrate, doped regions disposed in the substrate, and a first contact plug disposed over the substrate. In some embodiments, the doped regions are disposed in the substrate at two sides of the gate structure, respectively. In some embodiments, the first contact plug is electrically connected to one of the doped regions.

In some embodiments, each conductive island is electrically connected to the one of the doped regions through the first contact plug.

In some embodiments, the method further includes a bit line structure disposed over the substrate, and a second contact plug disposed over the substrate and electrically connecting the bit line structure to the other doped region.

In some embodiments, at least one of the conductive islands overlaps the second contact plug.

In some embodiments, the at least one of the conductive islands is electrically isolated from the second contact plug.

In the present disclosure, a method for preparing the semiconductor structure is provided. According to the method, the conductive islands are formed over the substrate. Further, the plurality of conductive islands are separated from each other by the first gaps, the second gaps and the cap layer. Accordingly, an issue of shorting between the plurality of conductive islands is mitigated by the provided method.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIGS. 3A, 4A, 5A, 6A, 7A and 8A are schematic diagrams illustrating various fabrication stages of the method for preparing the semiconductor structure in accordance with an embodiment of the present disclosure.

FIGS. 3B, 4B, 5B, 6B, 7B and 8B are cross-sectional views taken along line in FIGS. 3A, 4A, 5A, 6A, 7A and 8A, respectively.

DETAILED DESCRIPTION

Figure 1:
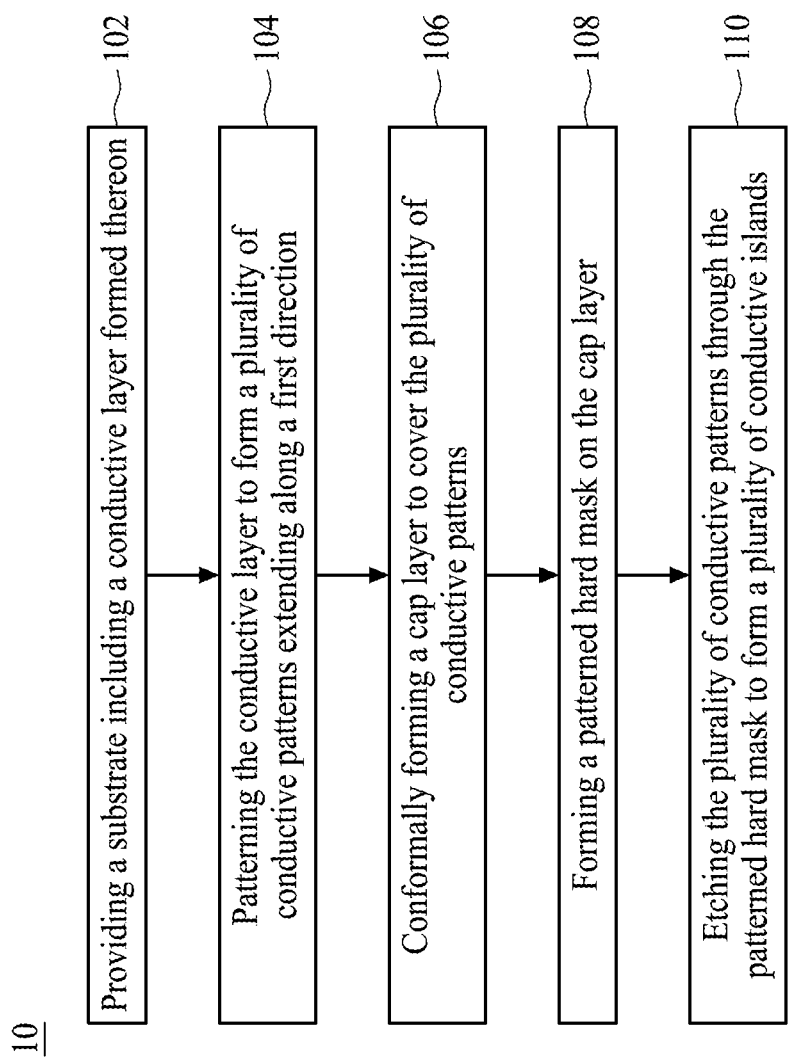
FIG. 1 is a flow diagram illustrating a method for preparing a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, regions, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, vias, pillars, trenches, troughs, or moats. As used herein, the term "core" refers to a mask feature formed at a vertical level. As used herein, the term "target layer" refers to a layer in which a pattern of semiconductor structures is to be formed. A target layer may be part of the substrate. A target layer may be a metal layer, a semiconductor layer, and/or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch process or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor structure in accordance with an embodiment of the present disclosure. The method for preparing a semiconductor structure 10 includes a step 102, providing a substrate including a conductive layer formed on the substrate. The method 10 further includes a step 104, patterning the conductive layer to form a plurality of conductive patterns extending along a first direction. The method 10 further includes a step 106, conformally forming a cap layer to cover the plurality of conductive patterns. The method 10 further includes a step 108, forming a patterned hard mask on the cap layer. The method 10 further includes a step 110, etching the plurality of conductive patterns through the patterned hard mask to form a plurality of conductive islands. The method for preparing the semiconductor structure 10 will be further described according to one or more embodiments below.

Figure 2A:
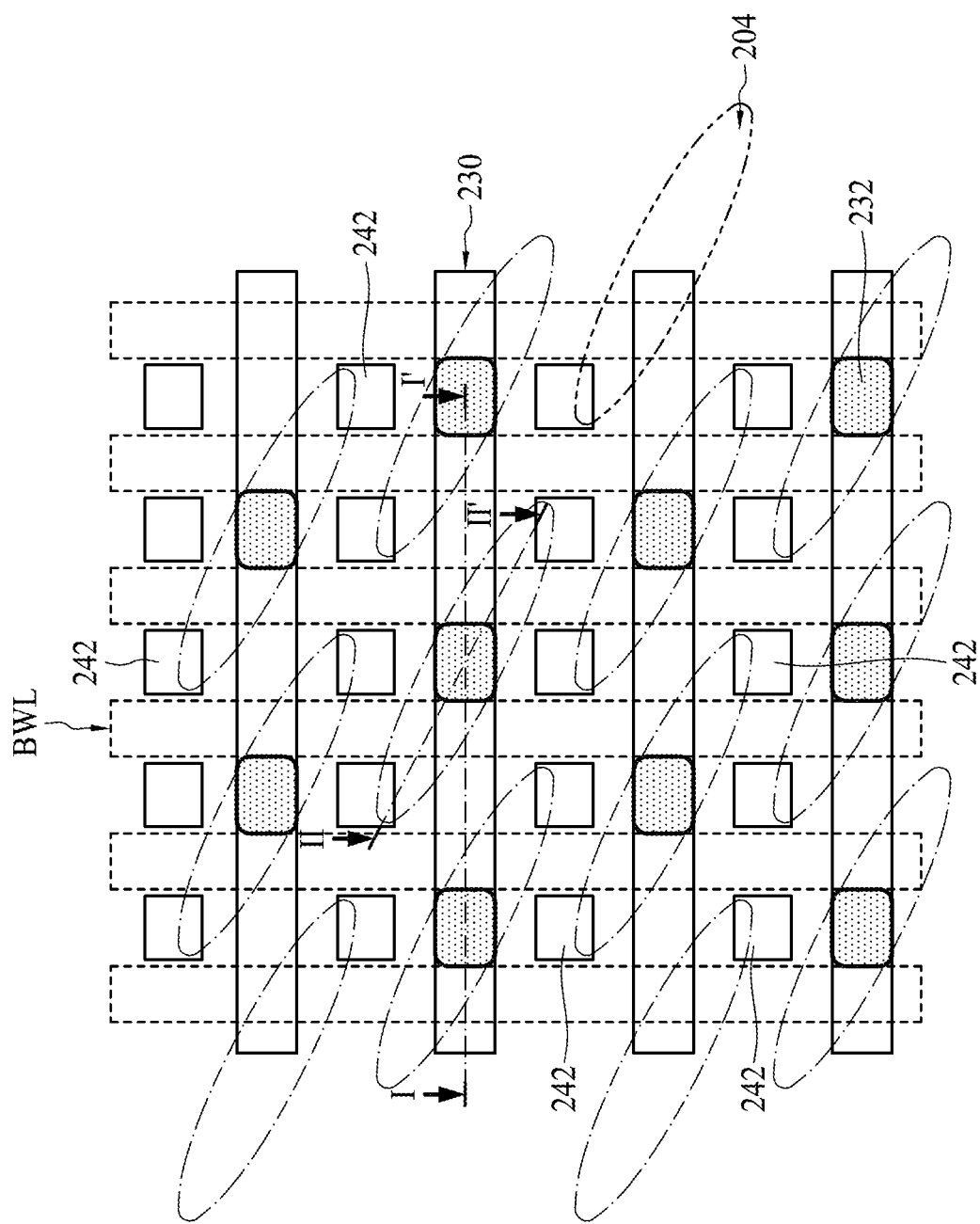
FIG. 2A is a layout structure illustrating a fabrication stage of the method for preparing the semiconductor structure in accordance with an embodiment of the present disclosure.
Figure 2B:
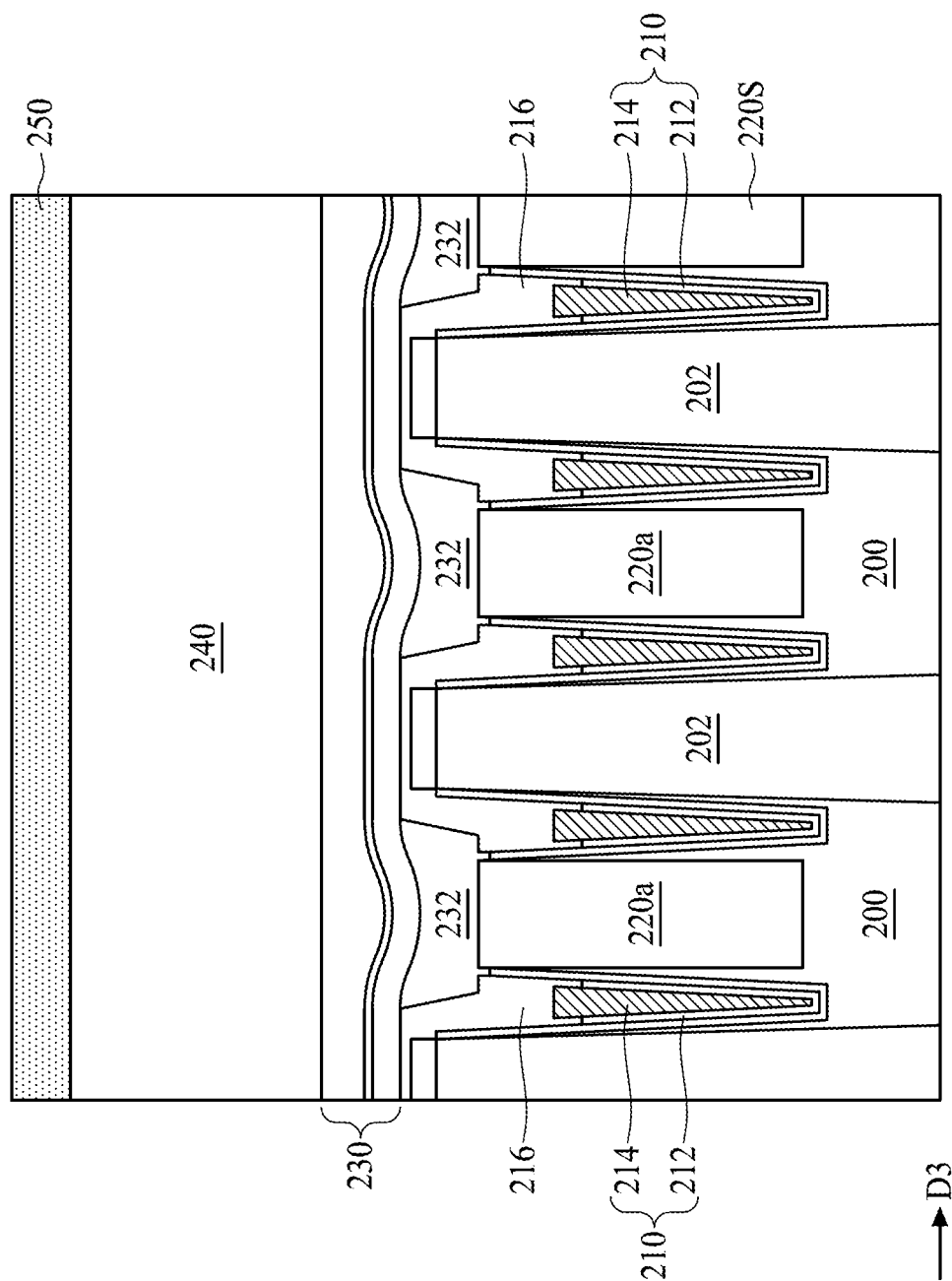
FIG. 2B is a cross-sectional view taken along line I-I' in FIG. 2A.
Figure 2C:
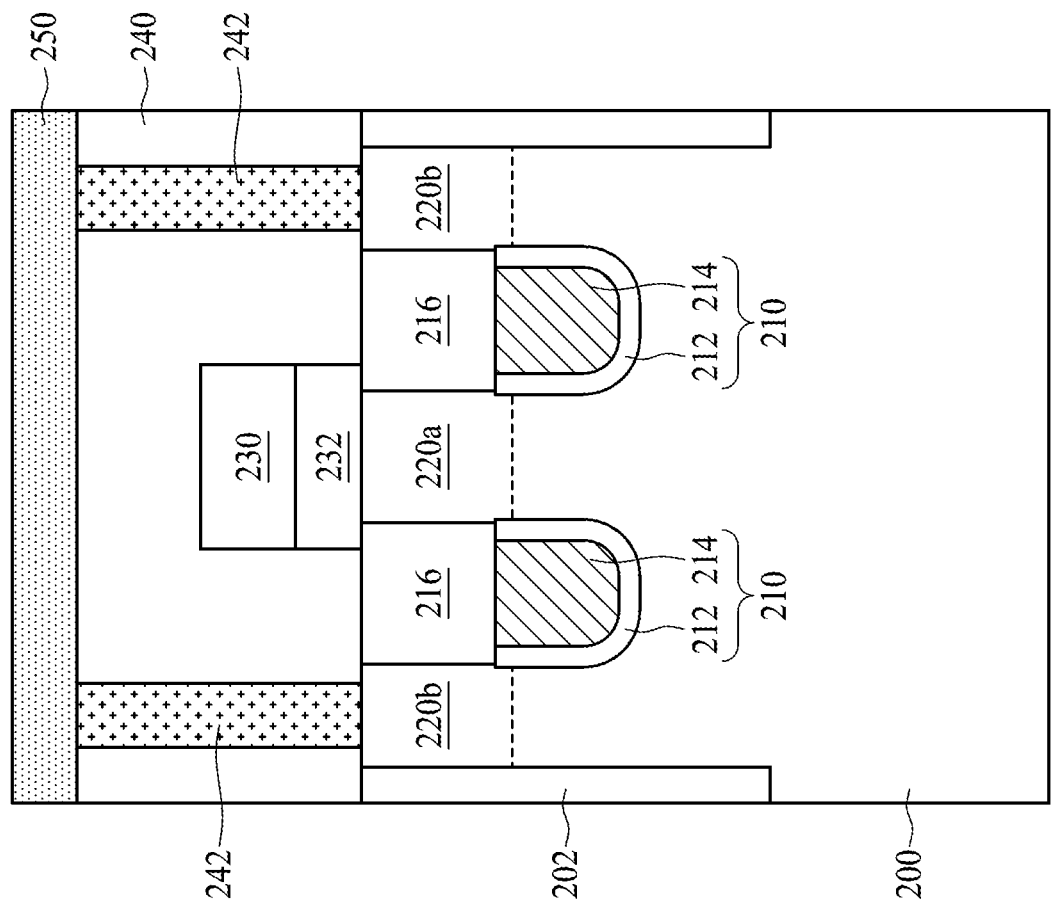
FIG. 2C is a cross-sectional view taken along line II-II' in FIG. 2A.

FIG. 2A is a layout structure illustrating a fabrication stage constructed according to the method for preparing the semiconductor structure in accordance with an embodiment of the present disclosure, FIG. 2B is a cross-sectional view taken along line I-I' of FIG. 2A, and FIG. 2C is a cross-sectional view taken along line II-II' in FIG. 2A. Referring to FIGS. 2A to 2C, a substrate 200 is provided. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof, but the disclosure is not limited thereto. A well region (not shown) may be formed in the substrate 200. The well region may be neutral, or may be an n-type or p-type doped region, depending on the conductivity type of the transistor structure formed thereafter. An isolation structure 202, such as a shallow trench isolation (hereinafter abbreviated as STI) structure, is formed in the substrate 200 for defining at least an active region 204.

In some embodiments, at least a gate structure 210 is disposed in the substrate 200 in the active region 204. In some embodiments, the gate structure 210 can be a buried gate structure, but the disclosure is not limited thereto. In some embodiments, two buried gate structures 210 can be formed in one active region 204, as shown in FIG. 8A, but the disclosure is not limited thereto. According to the embodiments, at least one trench (not shown) is formed in the substrate 200 by proper etchants. Next, a dielectric layer 212 covering sidewalls and a bottom of the trench is conformally formed in the trench. In some embodiments, the dielectric layer 212 can include dielectric material having high dielectric constant (high-k). For example, the dielectric layer 212 can include SiO, silicon nitride (SiN), silicon oxynitride (SiON), metal oxide such as hafnium oxide (HfO), or other suitable material chosen for compatibility, but the disclosure is not limited thereto. A conductive layer 214 is formed on the dielectric layer 212 and recessed such that a top surface of the conductive layer 214 is lower than an opening of the trench. In some embodiments, the conductive layer 214 can include polysilicon or other suitable material such as metal materials with proper work function, but the disclosure is not limited thereto. Next, an isolation structure 216 is formed to fill the trench, and a planarization process can be performed. Consequently, the buried gate structure 210, which serves as a buried word line (BWL) for a DRAM device, is obtained, as shown in FIG. 2A. Further, as shown in FIGS. 2B and 2C, a top surface of the buried gate structure 210 may be lower than a top surface of the isolation structure 216.

Next, doped regions 220a and 220b serving as source and drain regions are formed in the active region 204 at two opposite sides of the gate structure 210. The doped regions 220a and 220b include an n-type or a p-type doped region, depending on the conductivity type of the transistor structure to be formed. In some embodiments, the doped region 220a can be formed between the pair of buried gate structures 210, as shown in FIGS. 2B and 2C. That is, the two buried gate structures 210 share one doped region 220a. Accordingly, each buried gate structure 210 and the doped region 220a and 220b adjacent thereto may constitute a MOSFET device, which serves as a cell selection element. Further, because the buried gate structure 210 may have a three-dimensional structure, a channel length of the channel region may be increased, and a short-channel effect may be reduced.

Referring to FIGS. 2B and 2C, a bit line structure 230 is formed on the doped region 220a. In some embodiments, a contact plug 232 can be formed between the bit line structure 230 and the doped region 220a. After the forming of the contact plug 232 and the bit line structure 230, a dielectric structure 240 is formed on the substrate 200. As shown in FIGS. 2B and 2C, the dielectric structure 240 covers the bit line structure 230, the contact plug 232 and the substrate 200. In some embodiments, the dielectric structure 240 can be a single-layered structure. In other embodiments, the dielectric structure 240 can be a multi-layered structure.

Still referring to FIG. 2C, a contact plug 242 is formed in the dielectric structure 240. Further, the contact plug 242 is formed on the doped region 220b for each MOSFET device.

Referring to FIGS. 2B and 2C, after the forming of the contact plugs 242, a conductive layer 250 is formed over the substrate 200 according to step 102 of the method 10. As shown in FIGS. 2B and 2C, the conductive layer 250 is formed to completely cover the dielectric structure 240 and the contact plugs 242. Further, the conductive layer 250 is in contact with the contact plugs 242, as shown in FIG. 2C. The conductive layer 250 can include doped polysilicon (Si), tungsten (W), tungsten silicide (WSi), aluminum (Al), titanium (Ti), titanium nitride (TiN), cobalt (Co), but the disclosure is not limited thereto.

Referring to FIGS. 3A and 3B, next, a patterned hard mask 252 is formed on the conductive layer 250. In some embodiments, the patterned hard mask 252 can be formed by a multiple patterning method, such as a double patterning method, but the disclosure is not limited thereto.

Referring to FIGS. 4A and 4B, the conductive layer 250 is patterned through the patterned hard mask 252 according to step 104. Consequently, a plurality of conductive patterns 254 are formed, as shown in FIGS. 4A and 4B. In some embodiments, each conductive pattern 254 extends along a first direction D1, as shown in FIG. 4A. In some embodiments, an edge pattern 256 formed of the conductive layer 250 can also be formed by the patterning of the conductive layer 250 in step 104. In some embodiments, the plurality of conductive patterns 254 are coupled to the edge pattern 256, but the disclosure is not limited thereto. In some embodiments, a portion of the edge pattern 256 extends along a second direction D2, and another portion of the edge pattern 256 extends along a third direction D3. The second direction D2 and the third direction D3 are different from the first direction. In some embodiments, the second direction D2 and the third direction D3 are perpendicular to each other, but the disclosure is not limited thereto. In some embodiments, widths W of the plurality of conductive patterns 254 are the same. In some embodiments, spacing distances S between adjacent conductive patterns 254 are the same. In some embodiments, the width W of the plurality of conductive patterns 254 is greater than the spacing distance S between the adjacent conductive patterns 254, but the disclosure is not limited thereto. Additionally, portions of the dielectric layer 240 are exposed through the plurality of conductive patterns 254 and the edge pattern 256, but the disclosure is not limited thereto.

Figures 5A, 5B:
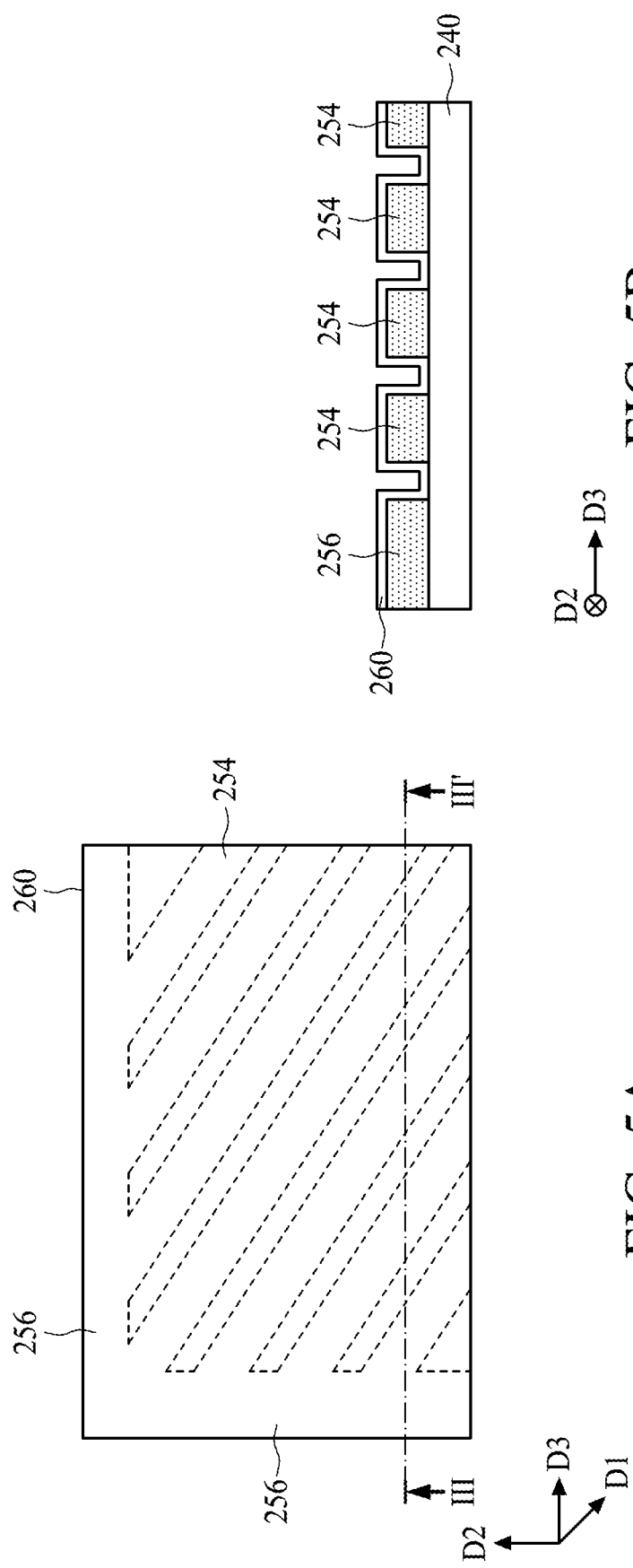

Referring to FIGS. 5A and 5B, a cap layer 260 is conformally formed to cover the conductive patterns 254 and the edge pattern 256, according to step 106. The cap layer 260 includes insulating material such as silicon nitride (SiN) or silicon oxynitride (SiON), but the disclosure is not limited thereto. A thickness of the cap layer 260 is between approximately 10 angstroms and approximately 100 angstroms, but the disclosure is not limited thereto. As shown in FIG. 5B, the cap layer 260 covers top surfaces of the plurality of conductive patterns 254 and the edge pattern 256. The cap layer 260 also covers sidewalls of the plurality of conductive patterns 254 and the edge pattern 256. Further, the portions of the dielectric layer 240 exposed through the plurality of conductive patterns 254 and the edge pattern 256 are covered by the cap layer 260, as shown in FIGS. 5A and 5B.

Referring to FIGS. 6A and 6B, in some embodiments, a passivation layer 262 is formed over the substrate 200 and the dielectric layer 240. In some embodiments, the passivation layer 262 can be a multiple-layered structure, as shown in FIG. 6B, but the disclosure is not limited thereto. The passivation layer 262 includes insulating materials. In some embodiments, the passivation layer 262 can include the insulating material having an etching rate the same as or similar to that of the cap layer 260, but the disclosure is not limited thereto. The passivation layer 262 is formed to fill spaces between adjacent conductive patterns 254. Consequently, a flat and even surface is obtained, as shown in FIG. 6B. Subsequently, a hard mask layer 264 is then formed on the flat and even surface provided by the passivation layer 262.

Referring to FIGS. 7A and 7B, the hard mask layer 264 is patterned to form a patterned hard mask 266 on the cap layer 260, according to step 108. In some embodiments, the patterned hard mask 266 can be formed by a multiple patterning method, such as a double patterning method, but the disclosure is not limited thereto.

Figure 8B:
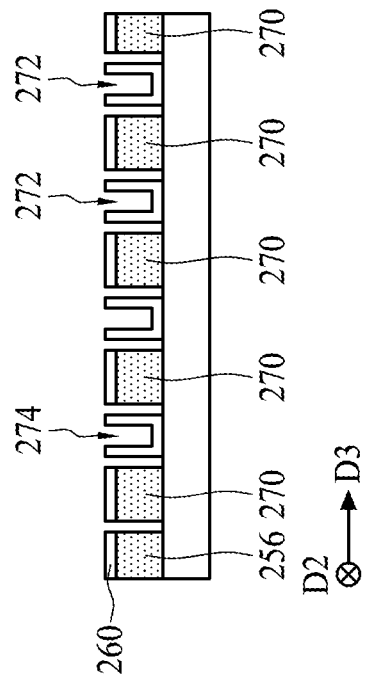
Figure 8C:
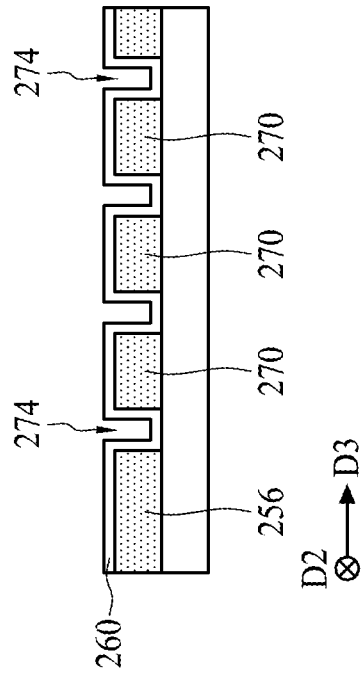
FIG. 8C is a cross-sectional view taken along line IV-IV' in FIG. 8A.
Figure 8A:
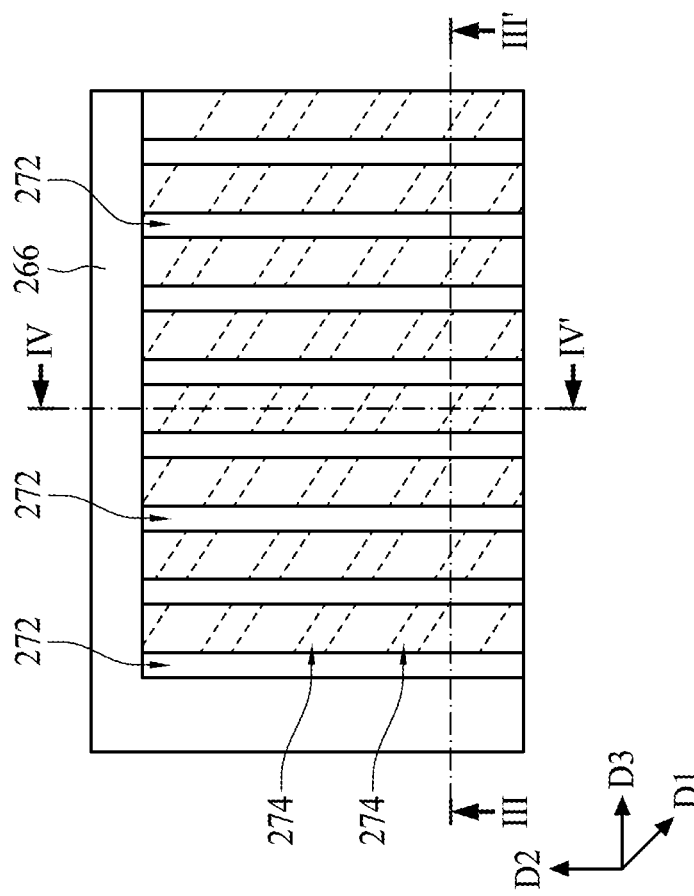

Referring to FIGS. 8A, 8B and 8C, the plurality of conductive patterns 254 are etched through the patterned hard mask 266 according to step 110. Consequently, each conductive pattern 254 is sectioned and thus a plurality of conductive islands 270 are obtained in step 110. In some embodiments, the plurality of conductive islands 270 are the same size. In some embodiments, the plurality of conductive islands 270 are separated from each other by a plurality of first gaps 272 along the first direction D1, as shown in FIG. 8A. The plurality of conductive islands 270 are separated from each other by the cap layer 260 and a plurality of second gaps 274 along the second direction D2, as shown in FIG. 8C. In some embodiments, the plurality of first gaps 272 extend along the second direction D2, and the plurality of second gaps 274 extends along the first direction D1. In some embodiments, the plurality of first gaps 272 and the plurality of second gaps 274 form a grid that separates the plurality of conductive islands 270 from each other, as shown in FIG. 8A. In some embodiments, a width of the plurality of first gaps 272 and a width of the plurality of second gaps 274 can be the same, but the disclosure is not limited thereto. In some alternative embodiments, the width of the plurality of first gaps 272 can be greater than or less than the width of the plurality of second gaps 274. Further, the plurality of conductive islands 270 are also separated from the edge pattern 256 by the etching of the conductive layer 250. As shown in FIG. 8A, the plurality of conductive islands 270 are separated from the edge pattern 266 by the plurality of first gaps 272 and the plurality of second gaps 274.

Still referring to FIGS. 8A, 8B and 8C, in some embodiments, the cap layer 260 covers only the top surface of the each conductive island 270 while sidewalls of the plurality of conductive islands 270 are exposed through the plurality of first gaps 272 along the third direction D3, as shown in FIG. 8B. In some embodiments, the cap layer 260 covers a top surface and sidewalls of each conductive island 270 along the second direction D2, as shown in FIG. 8C. In other words, the cap layer 260 covers bottom surfaces and sidewalls of the plurality of second gaps 274 along the second direction D2, as shown in FIG. 8C. Further, as shown in FIG. 8C, portions of the sidewalls of each conductive island 270 are covered by the cap layer 260, and thus strengthened by the cap layer 260.

Figure 9A:
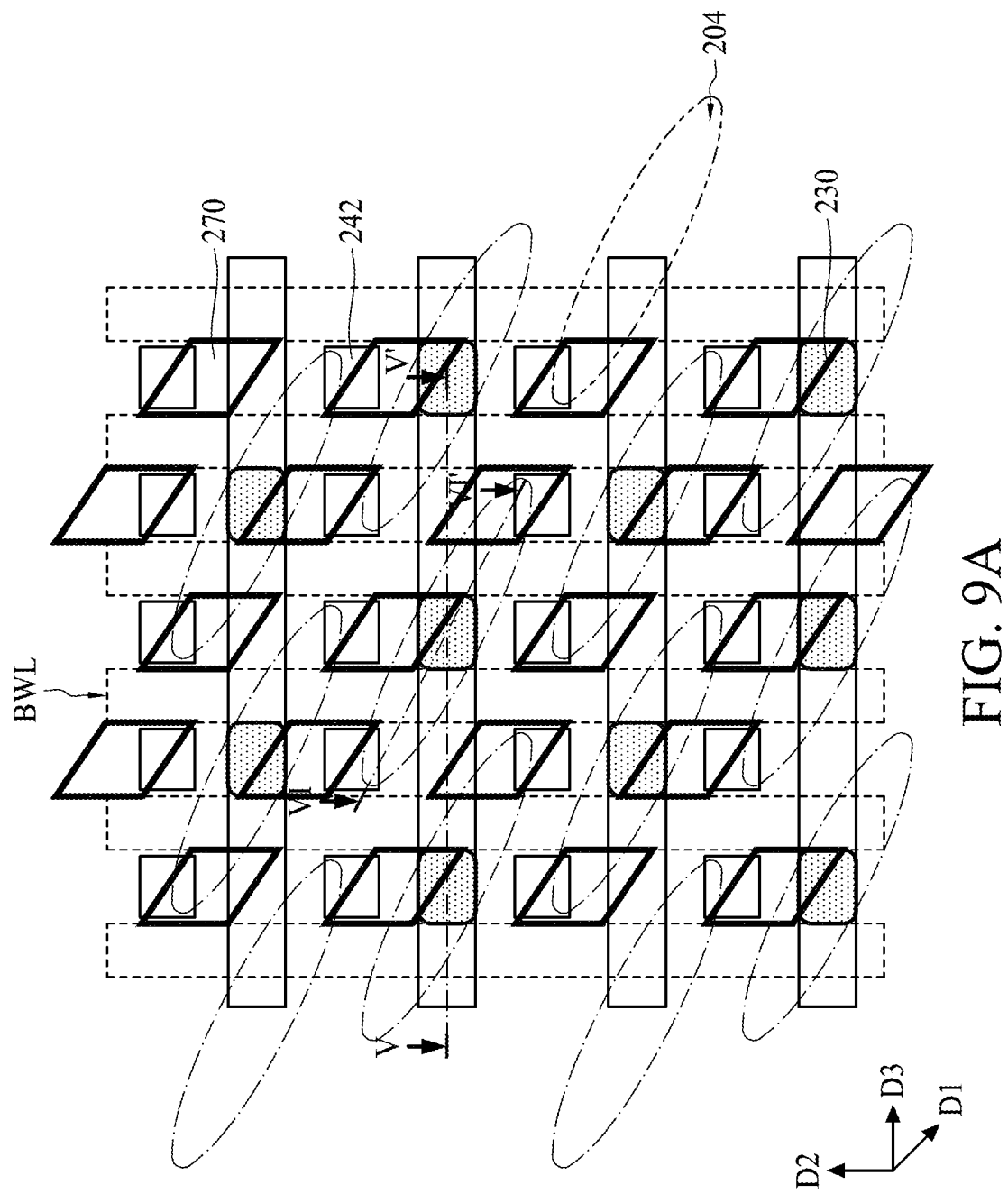
FIG. 9A is a layout structure of a plurality of DRAM cells
Figure 9B:
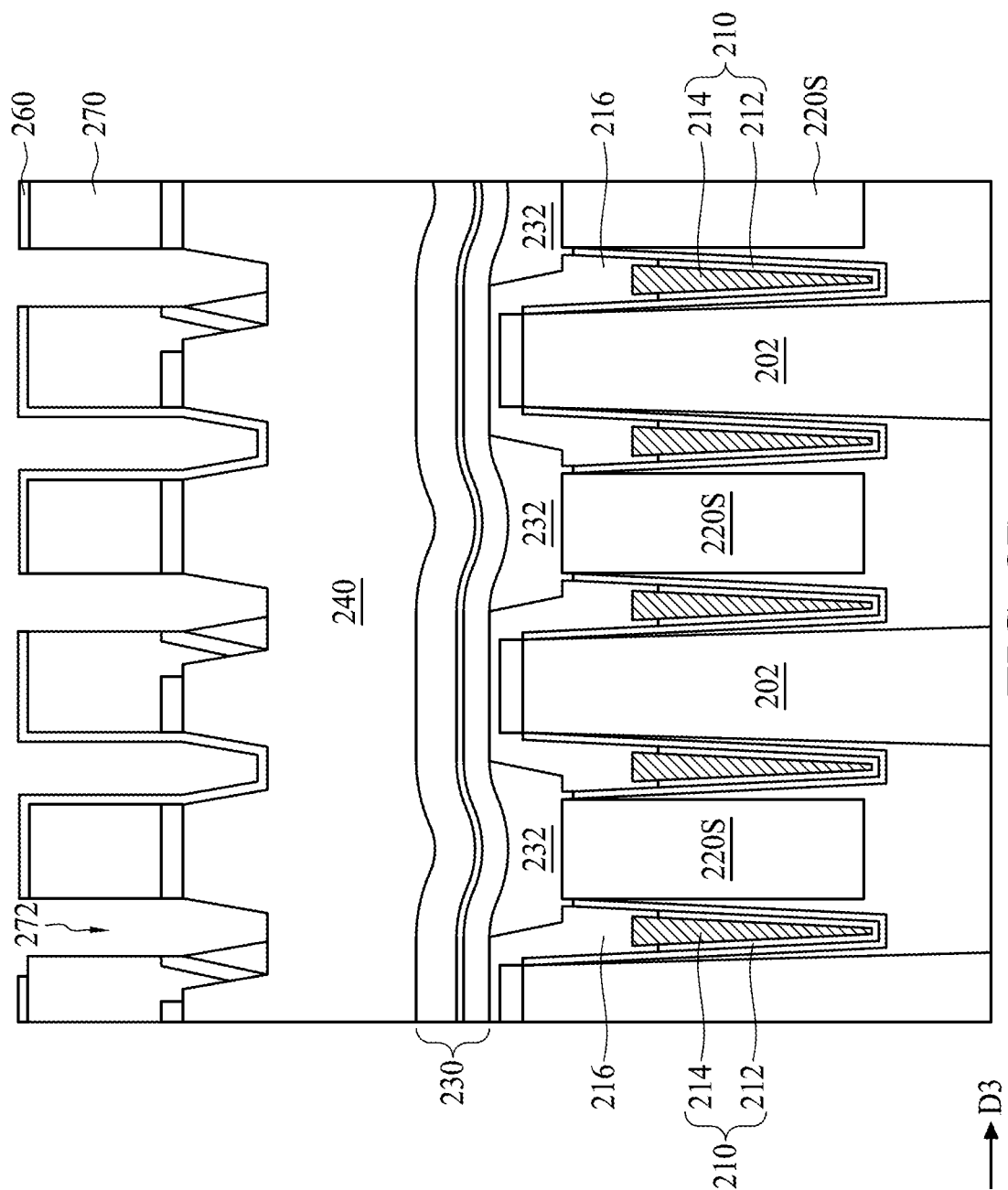
FIG. 9B is a cross-sectional view taken along line V-V' in FIG. 9A.

Referring to FIGS. 9A and 9B, each of the plurality of conductive islands 270 serves as a landing pad for a DRAM cell. In some embodiments, each of the plurality of conductive islands 270 may overlap a portion of the contact plugs 242, as shown in FIG. 9A. Further, the plurality of conductive islands 270 that overlap the contact plugs 242 are physically and electrically connected to the portion of the contact plugs 242. Accordingly, the plurality of conducive islands 270 are electrically connected to the doped region 220b for each MOSFET device through the contact plugs 242. In some embodiments, a capacitor (not shown) can be disposed over each conductive island 270. The capacitor can be electrically connected to the MOSFET device (i.e., the doped region 220b) through the landing pad (i.e., the conductive island) 270 and the conductive plug 242. Consequently, a DRAM cell including the MOSFET device and the capacitor is obtained.

In some embodiments, at least one of the conductive islands 270 overlaps a portion of the contact plug 230, as shown in FIG. 9A. However, the conductive island 270 that overlaps the contact plug 230 is physically and electrically isolated from the contact plug 230, as shown in FIG. 9B. Significantly, all of the conductive islands 270 are physically and electrically isolated from the contact plugs 230 by the dielectric structure 240, as shown in FIG. 9B. In some embodiments, the plurality of conductive islands 270 are isolated from the plurality of contact plugs 230 along a direction perpendicular to the surface of the substrate 200, and thus a horizontal offset distance between the plurality of conductive islands 270 and the plurality of contact plugs 230 is no longer needed.

In the present disclosure, the method for preparing the semiconductor structure 10 is provided. According to the method 10, the plurality of conductive islands 270 are formed over the substrate 200. Further, the plurality of conductive islands 270 are separated from each other by the first gaps 272, the second gaps 274 and the cap layer 260. Accordingly, an issue of shorting between the plurality of conductive islands 270 is mitigated by the provided method.

One aspect of the present disclosure provides a method for preparing a semiconductor structure. The method includes the following steps. A substrate including a conductive layer formed on the substrate is provided. The conductive layer is patterned to form a plurality of conductive patterns extending along a first direction. A cap layer is conformally formed to cover the plurality of conductive patterns. A patterned hard mask is formed over the cap layer. The plurality of conductive patterns are etched through the patterned hard mask to form a plurality of conductive islands. In some embodiments, the plurality of conductive islands are separated from each other by a plurality of first gaps along the first direction. In some embodiments, the plurality of conductive islands are separated from each other by the cap layer and a plurality of second gaps along a second direction that is different from the first direction.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor pattern structure, comprising:
    providing a substrate comprising a conductive layer formed thereon;
    patterning the conductive layer to form a plurality of conductive patterns extending along a first direction;
    conformally forming a cap layer to cover the plurality of conductive patterns;
    forming a patterned hard mask over the cap layer; and
    etching the plurality of conductive patterns through the patterned hard mask to form a plurality of conductive islands,
wherein the plurality of conductive islands are separated from each other by a plurality of first gaps along the first direction, and separated from each other by the cap layer and a plurality of second gaps along a second direction different from the first direction.

2. The method of claim 1, wherein the conductive layer comprises doped polysilicon (Si), tungsten (W), tungsten silicide (WSi), aluminum (Al), titanium (Ti), titanium nitride (TiN), or cobalt (Co).

3. The method of claim 1, further comprising forming an edge pattern, wherein the plurality of conductive patterns are coupled to the edge pattern.

4. The method of claim 3, wherein the plurality of conductive islands are separated from the edge pattern.

5. The method of claim 1, wherein the cap layer covers sidewalls and a top surface of each conductive pattern.

6. The method of claim 1, wherein the cap layer comprises an insulating material.

7. The method of claim 1, wherein a thickness of the cap layer is between approximately 10 angstroms and approximately 100 angstroms.

8. The method of claim 1, wherein the forming of the patterned hard mask further comprises:
    forming a passivation layer over the substrate to form an even surface;
    forming a hard mask layer on the passivation layer; and
    patterning the hard mask layer to form the patterned hard mask.

9. The method of claim 8, wherein a space between adjacent conductive patterns is filled with the passivation layer.

10. The method of claim 1, wherein the plurality of first gaps extend along the second direction, and the plurality of second gaps extend along the first direction.

11. The method of claim 10, wherein the plurality of first gaps and the plurality of second gaps form a grid that separates the plurality of conductive islands from each other.

12. The method of claim 10, wherein sidewalls of the plurality of conductive islands are exposed through the plurality of first gaps along a third direction different from the first direction and the second direction.

13. The method of claim 12, wherein the second direction and the third direction are perpendicular to each other.

14. The method of claim 10, wherein the cap layer covers a top surface and the sidewall of each conductive island along the second direction.

15. The method of claim 14, wherein the cap layer covers bottom surfaces and sidewalls of the plurality of second gaps along the second direction.

16. The method of claim 1, wherein the substrate further comprises:
    a gate structure disposed therein;
    doped regions disposed therein, wherein the doped regions are disposed respectively at two sides of the gate structure; and
    a first contact plug disposed over the substrate and electrically connected to one of the doped regions.

17. The method of claim 16, wherein each conductive island is electrically connected to the one of the doped regions through the first contact plug.

18. The method of claim 16, further comprising:
    a bit line structure disposed over the substrate; and
    a second contact plug disposed over the substrate and electrically connecting the bit line structure to the other doped region.

19. The method of claim 18, wherein at least one of the conductive islands overlaps the second contact plug.

20. The method of claim 19, wherein the at least one of the conductive islands is electrically isolated from the second contact plug.

* * * * *